(12) United States Patent
Shim

(10) Patent No.: US 7,307,903 B2
(45) Date of Patent: Dec. 11, 2007

(54) METHOD FOR TESTING MEMORY DEVICE

(75) Inventor: Young Bo Shim, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 11/382,738

(22) Filed: May 11, 2006

(65) Prior Publication Data
US 2007/0025168 A1    Feb. 1, 2007

(30) Foreign Application Priority Data
May 11, 2005    (KR)    ............. 10-2005-0039257

(51) Int. Cl.
*G11C 7/00*    (2006.01)
(52) U.S. Cl. .............. 365/201; 365/203; 365/230.03
(58) Field of Classification Search ............... 365/201, 365/203, 230.03, 233
See application file for complete search history.

(56) References Cited

U.S. PATENT DOCUMENTS

| | | | |
|---|---|---|---|
| 5,923,181 A | 7/1999 | Beilstein, Jr. et al. | |
| 6,229,329 B1 | 5/2001 | Nakata et al. | |
| 6,459,635 B1 * | 10/2002 | Mullarkey et al. | 365/201 |
| 6,621,285 B1 | 9/2003 | Yatsu | |
| 7,057,950 B2 * | 6/2006 | Lee | 365/203 |
| 2004/0006728 A1 | 1/2004 | Scholten | |
| 2004/0153793 A1 | 8/2004 | Jarboe, Jr. et al. | |

FOREIGN PATENT DOCUMENTS

| | | |
|---|---|---|
| JP | 2003 36690 | 2/2003 |
| JP | 2003 315414 | 11/2003 |
| JP | 2004 77471 | 3/2004 |
| KR | 1019970048538 | 7/1997 |
| KR | 1020000031922 | 6/2000 |

OTHER PUBLICATIONS

Korean Patent Gazette from Korean Patent Office. Publication date: Mar. 9, 2007.

* cited by examiner

*Primary Examiner*—David Lam
(74) *Attorney, Agent, or Firm*—Ladas & Parry LLP (57) ABSTRACT

Disclosed is a method for testing a memory device, which can test a memory cell block while testing another memory cell block, so as to catch a process defect of the memory device within a short time period, thereby reducing the test time. The method for testing a memory device provided with a bank including N memory cell blocks and sense amplifiers, the method comprising the steps of: a) expressing the N memory cell blocks as a first, a second, . . . , an Nth memory cell block; b) sequentially activating odd-numbered memory cell blocks of the N memory cell blocks one by one in a predetermined time period; c) performing sense, read (or write) and precharge operations for each activated memory cell block; and d) performing steps a) to c) for even-numbered memory cell blocks after tests for all the odd-numbered memory cell blocks are finished.

10 Claims, 5 Drawing Sheets

METHOD FOR TESTING MEMORY DEVICE

BACKGROUND OF THE INVENTION

1. Field of the Invention

The present invention relates to a method for testing a memory device, and more particularly to a method for detecting a process defect of a memory device within a short period of time.

2. Description of the Prior Art

As generally known in the art, a memory device includes a memory bank for storing data, a row circuit unit and a column circuit unit for reading/writing data from/to the memory bank, and an input/output unit for inputting/outputting data.

From among these components, the memory bank including a plurality of memory cell arrays performs a very important function in the memory device. However, a leakage current may be introduced into an unspecific bit line of the memory band due to a process defect, so that cell fault may occur due to the leakage current.

Therefore, a manufacturer screens various failures in the memory bank through several steps and various methods. As a result of the screen, when a cell having a defect is detected, the cell is replaced with a redundancy circuit.

A memory bank includes a plurality of memory cell blocks (see FIG. 1 for the construction of a memory bank), and the memory cell blocks are sequentially tested. That is, after the test for a first memory cell block has been finished, the test for a second memory cell block is performed. After the test for the second memory cell block has been finished, the test for a third memory cell block is performed. In such a manner, the test is sequentially performed until the test for the last memory cell block has been completed.

However, in order to test one word line through active, write, and precharge operations, several hundreds of μs to several ms may be required. Therefore, the conventional test method has a problem in that a very long test time is required to detect a weak cell.

SUMMARY OF THE INVENTION

Accordingly, the present invention has been made to solve the above-mentioned problems occurring in the prior art, and an object of the present invention is to provide a method capable of testing a memory cell block while testing another memory cell block, thereby reducing required test time.

In accordance with the present invention in order to accomplish the above objects, there is provided a method for testing a memory device provided with a bank which includes a plurality of memory cell blocks, the method comprising the steps of: a) activating one of the memory cell blocks and then activating other memory cell blocks one by one in a predetermined time period; and b) performing sense, read (or write) and precharge operations for an activated memory cell block from among the memory cell blocks.

Herein, the active, sense, read and precharge operations are performed by commands applied from an exterior of the memory device.

Herein, the active, sense, read and precharge operations are performed sequentially for a plurality of word lines included in each of the memory cell blocks.

Herein, when sense, read (or write) and precharge operations for one of the memory cell blocks have been finished through step b), one of remaining memory cell blocks is activated.

In accordance with the present invention, there is provided a method for testing a memory device provided with a bank which includes N number of memory cell blocks and sense amplifiers located between the memory cell blocks, the method comprising the steps of: a) expressing the N memory cell blocks as a first, a second, . . . , an Nth (herein, 'N' is a natural number exceeding 'three') memory cell block; b) activating one of odd-numbered (first, third, fifth, . . . ) memory cell blocks from among the N memory cell blocks, and then activating remaining odd-numbered memory cell blocks one by one in a predetermined time period; c) performing sense, read (or write) and precharge operations for each activated memory cell block from among the odd-numbered memory cell blocks; and d) performing steps a) to c) for even-numbered memory cell blocks after tests for all the odd-numbered memory cell blocks have been finished.

Herein, the active, sense, read and precharge operations are performed sequentially for a plurality of word lines included in each of the N memory cell blocks.

Herein, when the sense, read (or write) and precharge operations for one of the odd-numbered memory cell blocks have been finished through step c), one of the remaining odd-numbered memory cell blocks is activated; and when the sense, read (or write) and precharge operations for one of the even-numbered memory cell blocks have been finished through step d), one of remaining even-numbered memory cell blocks is activated.

In accordance with the present invention, there is provided a method for testing a memory device provided with a bank which includes N number of memory cell blocks and sense amplifiers located between the memory cell blocks, the method comprising the steps of: a) expressing the N memory cell blocks as a first, a second, . . . , an Nth (herein, 'N' is a natural number exceeding 'three') memory cell block; b) activating one of even-numbered (second, fourth, sixth, . . . ) memory cell blocks from among the N memory cell blocks, and then activating remaining even-numbered memory cell blocks one by one in a predetermined time period; c) performing sense, read (or write) and precharge operations for each activated memory cell block from among the even-numbered memory cell blocks; and d) performing steps a) to c) for odd-numbered (first, third, fifth, . . . ) memory cell blocks after tests for all the even-numbered memory cell blocks have been finished.

Herein, the active, sense, read and precharge operations are performed sequentially for a plurality of word lines included in each of the N memory cell blocks.

Herein, when the sense, read (or write) and precharge operations for one of the even-numbered memory cell blocks have been finished through step c), one of the remaining even-numbered memory cell blocks is activated; and when the sense, read (or write) and precharge operations for one of the odd-numbered memory cell blocks have been finished through step d), one of remaining even-numbered memory cell blocks is activated.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Hereinafter, a preferred embodiment of the present invention will be described with reference to the accompanying drawings. In the following description and drawings, the same reference numerals are used to designate the same or similar components, and so repetition of the description on the same or similar components will be omitted.

Figure 1:
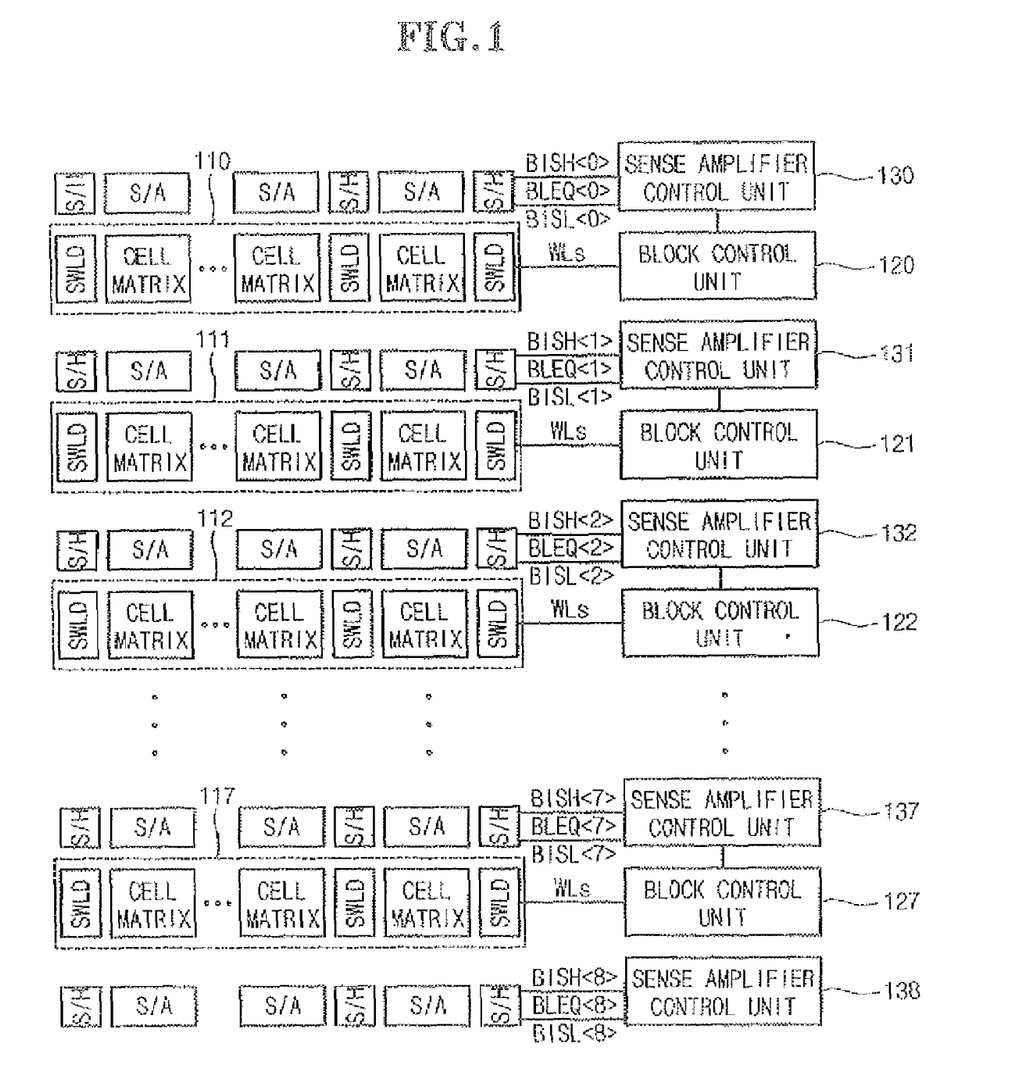
FIG. 1 is a block diagram illustrating a memory core unit to which a memory test method of the present invention is applied.

FIG. 1 is a block diagram illustrating a memory core unit to which a memory test method of the present invention is applied. For reference, the memory core unit includes a memory bank for storing data and an adjacent part of the memory bank.

Referring to FIG. 1, the memory bank includes a plurality of memory cell blocks 110 to 117, each of which contains a plurality of cell matrixes. Herein, the cell matrix represents a cell array including a plurality of memory cells. For example, each cell matrix may be configured with 512×256 bits. For reference, when there are eight memory cell blocks per memory bank and there are 512 word lines per memory cell block, a 9-bit row address is required in order to select 512 word lines of one memory cell block, and a 3-bit address is required in order to select the eight memory cell blocks.

Block control units 120 to 127 control signals relating to the word lines of the memory cell blocks 110 to 117. That is, the block control units 120 to 127 enable or disable the word lines in response to an active command or precharge command. As shown in FIG. 1, the block control units 120 to 127 are constructed to correspond one-to-one with the memory cell blocks 110 to 117.

Sense amplifier control units 130 to 138 control signals relating to the operation of sense amplifiers.

In a normal operation mode, the sense amplifier control units 130 to 138 enable or precharge the sense amplifiers in response to an active command or precharge command.

Also, each of the sense amplifier control units 130 to 138 controls not only signals 'BISH' and 'BISL' for controlling upper and lower bit line isolation transistors to connect its corresponding memory cell block to the corresponding sense amplifiers, but also relevant sub-hole blocks 'S/H'.

In a test mode, the sense amplifier control units 130 to 138 activate or precharge the sense amplifiers based on a burst stop command or precharge command. Also, each of the sense amplifier control units 130 to 138 controls not only signals 'BISH' and 'BISL' for controlling upper and lower bit line isolation transistors to connect its corresponding memory cell block to the corresponding sense amplifiers, but also relevant sub-hole blocks 'S/H'.

In an active operation, the sense amplifier 'S/A' senses and amplifies a fine voltage difference between a pair of bite lines 'Bit' and '/Bit'.

Each sub-word-line driver 'SWLD' functions to drive sub-word lines for controlling cell transistors, which are contained in, cell matrixes located at both sides of the relevant sub-word-line driver. In detail, when a sub-word line is enabled to a high level by a row address in response to an active command, the cell transistor connected to the sub-word line is enabled, and data stored in the cell transistor are transferred to a corresponding bit line. Also, when a sub-word line is disabled to a low level in response to a precharge command, the cell transistor connected to the sub-word line is disabled, and data stored in the cell transistor is maintained.

The sub-hole block 'S/H' includes main input/output lines 'MIO' and '/MIO', local input/output lines 'LIO' and '/LIO', and block switch transistors for connecting the main input/output lines and the local input/output lines. The sub-hole block 'S/H' transfers data applied through a data pin to a bit line during a write operation, and transfers data of a bit line, which have been amplified by a sense amplifier, to an input/output data pad during a read operation.

Figure 2:
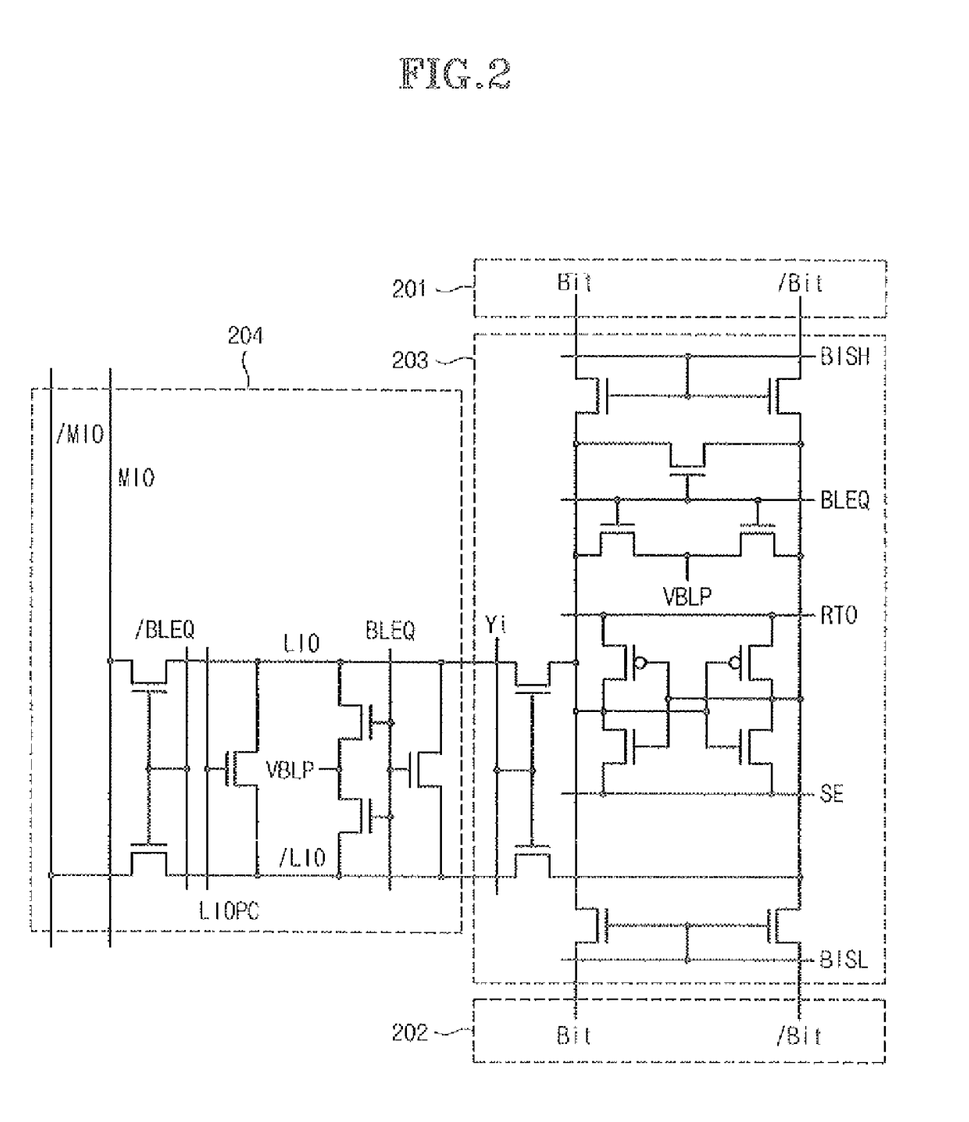
FIG. 2 is a detailed circuit of a cell matrix, a sense amplifier and a sub-hole block shown in FIG. 1.

FIG. 2 is a detailed circuit of a cell matrix, a sense amplifier and a sub-hole block shown in FIG. 1. Herein, reference numerals '201' and '202' represent cell matrixes, reference numeral '203' represents a sense amplifier, and number '204' represents a sub-hole block. In addition, signal 'RTO' represents a restore signal, and signal 'SE' represents a sense enable signal. The signals 'RTO' and 'SE' control the sensing operation of the sense amplifier.

Signal 'BISH' represents a 'Bit Line Isolation High' sign, and controls upper-side bit line isolation transistors of the sense amplifiers connected to a cell matrix.

Signal 'BISL' represents a 'Bit Line Isolation Low' signal, and controls lower-side bit line isolation transistors of the sense amplifiers connected to a cell matrix.

Signal 'VBLP' represents a bit-line precharge voltage.

'LIO' and '/LIO' represent local input and output lines, and are connected between a sense amplifier and main input/output lines 'MIO' and '/MIO'.

The 'MIO' and '/MIO' represent main input and output lines. First ends of the main input/output lines are connected to the local input/output lines, and second ends of the main input/output lines are connected to a main sense amplifier and a write driver (not shown). In a read operation, read data are transferred to a data pin via bit lines, the local input/output lines and the main input/output lines. In contrast, in a write operation, write data are transferred to the bit lines via the data pin, the main input/output lines and the local input/output lines.

Signal 'BLEQ' represents a bit-line equalize signal.

In a normal operation mode, signal 'BLEQ' shifts to a low level when an active command is applied to select a memory cell block, and signal 'BLEQ' shifts to a high level when a precharge command is applied.

In a test mode, signal 'BLEQ' shifts to a low level when a memory cell block is selected by a burst stop command while the memory is being in an active state, and signal 'BLEQ' shifts to a high level when a precharge command is applied.

Signal 'Yi' represents an interior column address. When a read command (or a write command) is inputted while the memory is being in an active state, an interior column address signal 'Yi' corresponding to an exterior column address applied from the exterior is enabled. Accordingly, the local input/output lines 'LIO' and '/LIO' are connected to bit lines connected to the sense amplifier. As a result, data of bit lines, which have been amplified by the sense amplifier, are outputted through the local input/output lines to the exterior.

Signal '/BLEQ' represents the inverted signal of signal 'BLEQ', and controls the on/off operations of transistors which are connected between the local input/output lines 'LIO' and '/LIO' and the main input/output lines 'MIO' and '/MIO'.

Signal 'LIOPC' represents a local input/output line precharge signal, and controls a transistor connected between the local input/output lines 'LIO' and '/LIO'.

Figure 3:
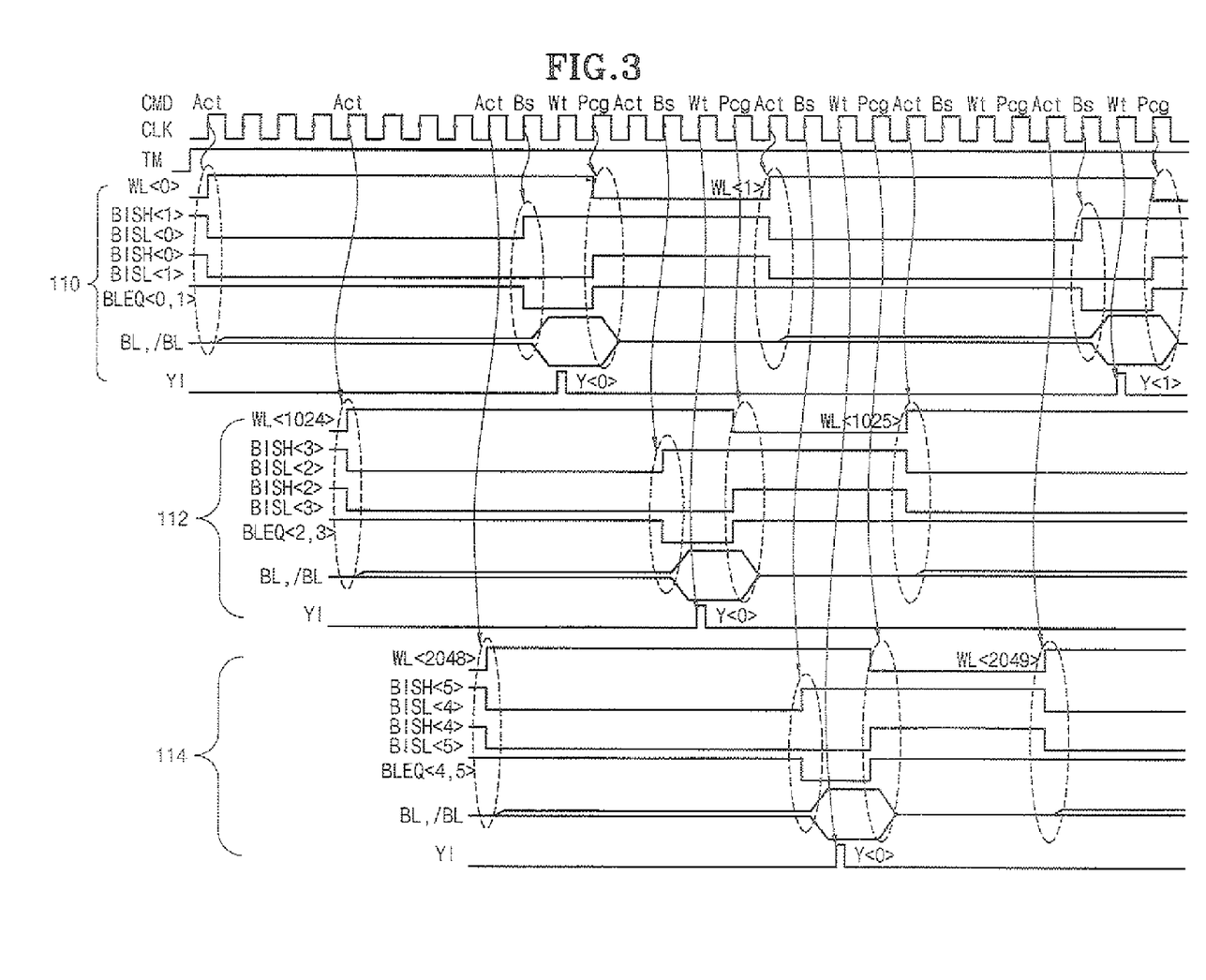
FIG. 3 is an internal timing diagram of a sense amplifier.
Figure 4:
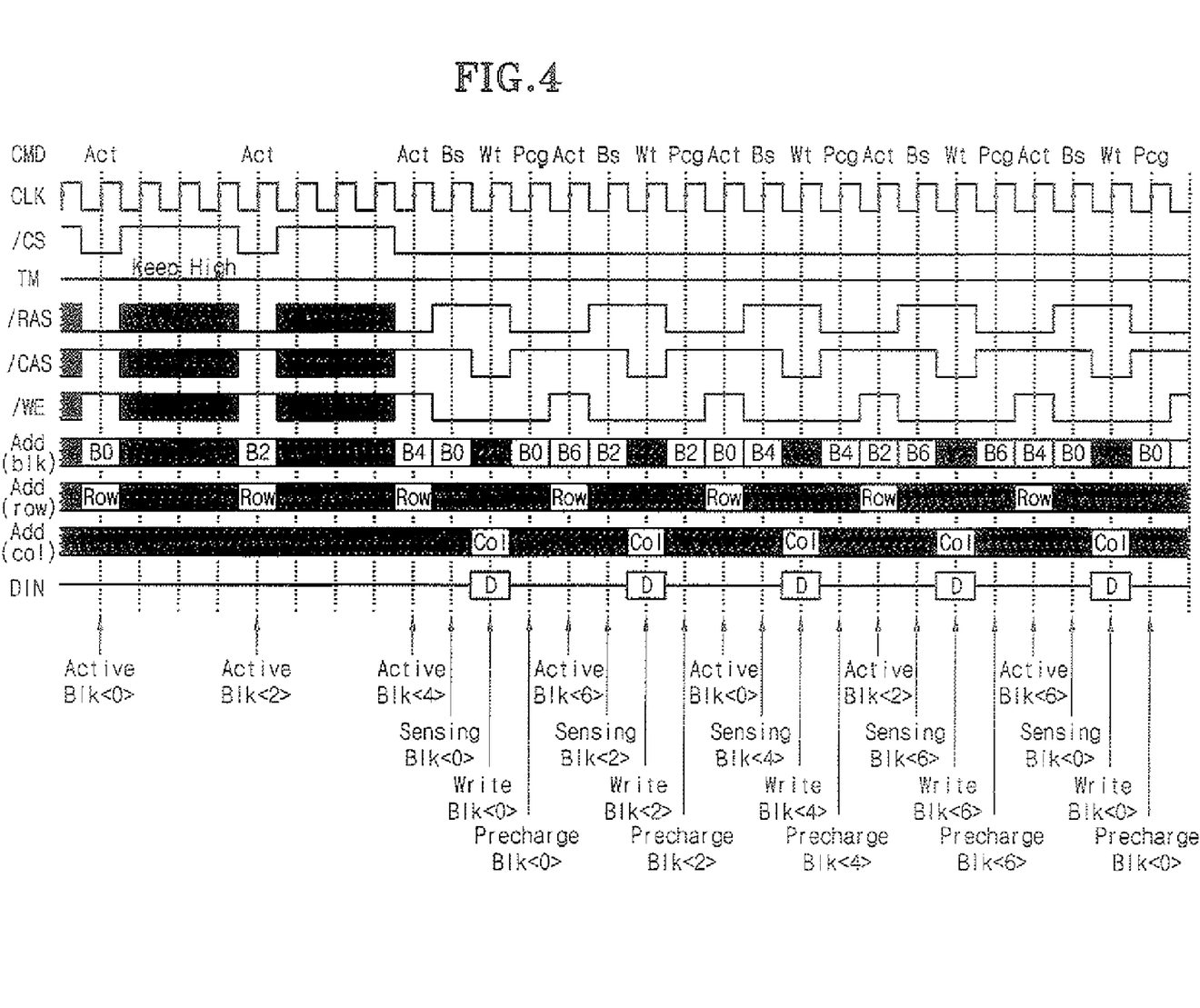
FIG. 4 is a write timing diagram.
Figure 5:
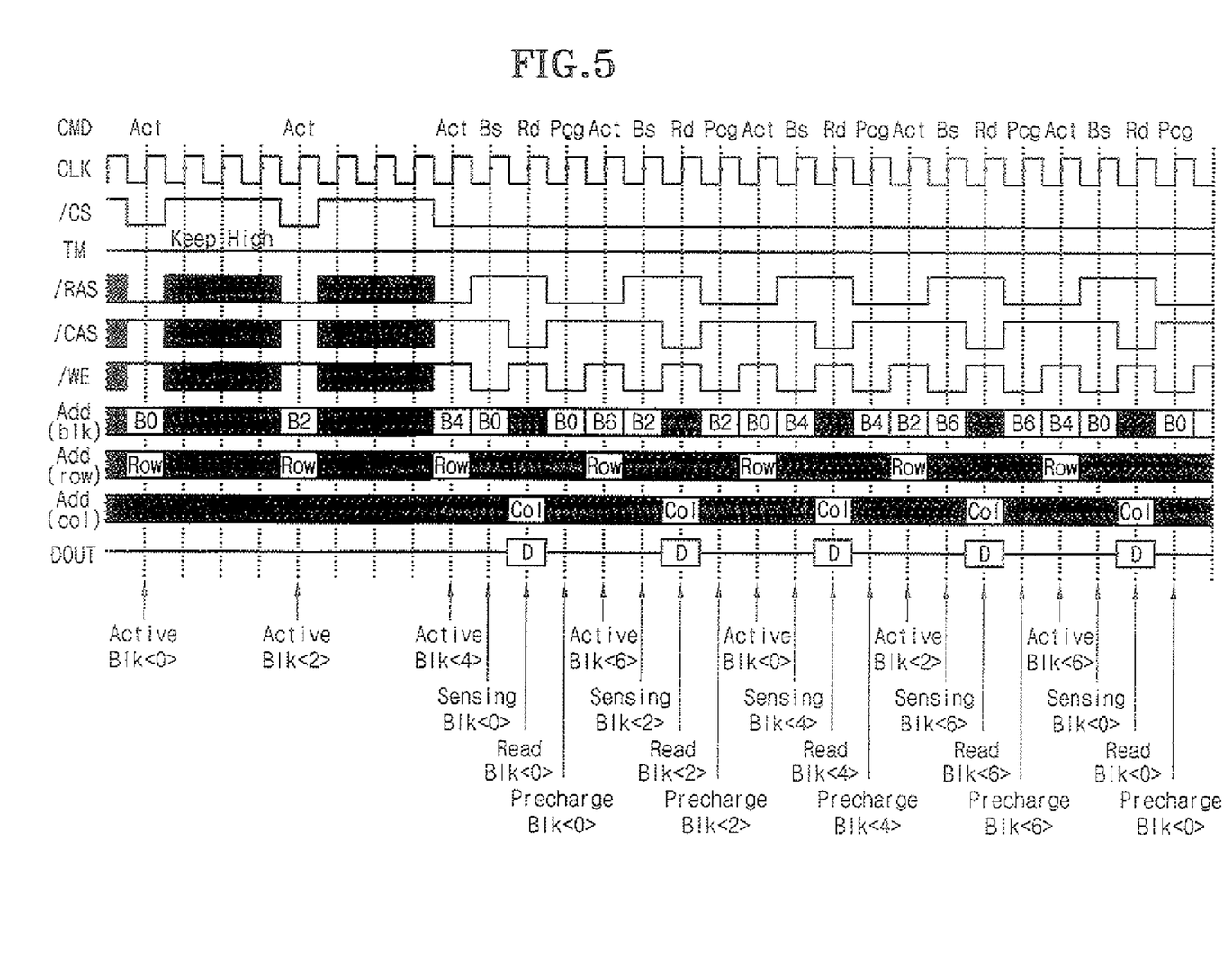
FIG. 5 is a read timing diagram.

FIG. 3 is a view illustrating a test method according to an embodiment of the present invention, FIG. 4 is a view illustrating a write operation according to an embodiment of the present invention, and FIG. 5 is a view illustrating a read operation according to an embodiment of the present invention.

Hereinafter, description will be made with reference to FIGS. 1 to 5 in relation to a method for sequentially activating, sensing, writing (or reading) and precharging the odd-numbered memory cell blocks 111, 113, 115 and 117 after sequentially activating, sensing, writing (or reading) and precharging the even-numbered memory cell blocks 110, 112, 114 and 116 from among a plurality of memory cell blocks. For reference, the method for sequentially testing odd-numbered memory cell blocks after even-numbered memory cell blocks have been sequentially tested is called an 'interleave' test method or a 'ping-pong' test method.

A test mode starts when a test mode signal 'TM' is set to a high level as shown in FIG. 3. For reference, in FIG. 3, reference numeral '110' represents a memory cell block 110, reference numeral '112' represents a memory cell block 112, and reference numeral '114' represents a memory cell block 114.

The following description will be given according to an application sequence of signals for testing a memory device.

1) Activation of Memory Cell Block 110:

When an active command 'Act' is inputted from the exterior together with a block address for appointing the memory cell block 110 and a row address for selecting a specific word line in the memory cell block 110 appointed by the block address, signals 'BISH<0>', 'BISH<1>', 'BISL<0>' and 'BISL<1>' shift to a low level. Therefore, the upper-side and lower-side bit line isolation transistors of a corresponding sense amplifier are all disabled, and the bit lines are isolated from the sense amplifier. In this case, a selected word line <0> is enabled to a high level, and cell data are transferred to the bit lines through charge sharing. Herein, the word line <0> represents a first word line of the memory cell block 110.

2) Activation of Memory Cell Block 112:

After a predetermined time period elapses, when an active command is inputted together with a block address for appointing the memory cell block 112 and a row address for selecting a specific word line in the memory cell block 112 appointed by the block address, signals 'BISH<2>', 'BISH<3>', 'BISL<2>' and 'BISL<3>' shift to a low level. Therefore, the upper-side and lower-side bit line isolation transistors of a corresponding sense amplifier are all disabled, and the bit lines are isolated from the sense amplifier. In this case, a selected word line <1024> is enabled to a high level, and cell data are transferred to the bit lines through charge sharing. Herein, the word line <1024> represents a first word line of the memory cell block 112.

3) Activation of Memory Cell Block 114:

When an active command is inputted together with a block address for appointing the memory cell block 114 and a row address for selecting a specific word line in the memory cell block 114 appointed by the block address, signals 'BISH<4>', 'BISH<5>', 'BISL<4>' and 'BISL<5>' shift to a low level. Therefore, the upper-side and lower-side bit line isolation transistors of a corresponding sense amplifier are all disabled, and the bit lines are isolated from the sense amplifier. In this case, a selected word line <2048> is enabled to a high level, and cell data are transferred to the bit lines through charge sharing. Herein, the word line <2048> represents a first word line of the memory cell block 114.

4) Sensing of Memory Cell Block 110:

When a burst stop command 'Bs' is inputted from the exterior together with a block address for appointing the memory cell block 110, signals 'BLEQ<0>' and 'BLEQ<1>' shift to a low level. Therefore, transistors controlled by signals 'BLEQ<0>' and 'BLEQ<1>' are disabled. At the same time, block switch transistors connecting the local input/output lines 'LIO' and '/LIO' and the main input/output lines 'MIO' and '/MIO' are enabled by signal '/BLEQ', thereby being in a ready state for a write or read operation. Then, signals 'BISH<1>' and 'BISL<0>' shift from a low level to a high level, so that bit line isolation transistors are disabled. As a result, the electric potential levels of the bit lines 'Bit' and '/Bit', to which charge has been shared, are transferred to the sense amplifier. Then, signal 'RTO' for the sense amplifier is activated to a high level and signal 'SE' for the sense amplifier is activated to a low level, so that a voltage difference (ΔV) between the bit lines 'Bit' and '/Bit' is sensed and amplified.

5) Write (or Read) of Memory Cell Block 110:

When a write command 'Wt' (or read command) is inputted together with a column address, an interior column address signal 'Yi' is generated (in this case, signal 'LIOPC' shifts to a low level). Accordingly, data of the local input/output lines 'LIO' and '/LIO', which have passed through the block switch transistors via the main input/output lines 'MIO' and '/MIO', are transferred to the bit lines connected to the sense amplifier. For reference, in the case of a read operation, when an interior column address signal 'Yi' is enabled, data of bit lines having been amplified by the sense amplifier are transferred to the main input/output lines via the local input/output lines and the block switch transistors.

6) Precharge of Memory Cell Block 110:

When a precharge command 'Pcg' is applied together with a block address for appointing the memory cell block 110, a word line 'WL<0>' shifts to a low level, and memory cell data are protected. Then, signals 'BISH<0>' and 'BISL<1>', which have been in a low level, shift to a high level, thereby enabling the bit line isolation transistors to which the signals 'BISH<0>' and 'BISL<1>' are inputted. Then, signals 'BLEQ<0>' and 'BLEQ<1>' shift from a low level to a high level, thereby precharging the bit lines 'Bit' and '/Bit' and the local input/output lines 'LIO' and '/LIO' to a voltage level of 'VBLP'. At the same time, the block switch transistors connecting the local input/output lines 'LIO' and '/LIO' and the main input/output lines 'MIO' and '/MIO' are disabled by signal '/BLEQ', thereby shutting off the transmission of the data.

7) Activation of Memory Cell Block 116:

When an active command is inputted together with a block address for appointing the memory cell block 116 and a row address for selecting a specific word line in the memory cell block 116 appointed by the block address, signals 'BISH<6>', 'BISH<7>', 'BISL<6>' and 'BISL<7>' shift to a low level. Accordingly, the upper-side and lower-side bit line isolation transistors of a corresponding sense amplifier are all disabled, and the bit lines are isolated from the sense amplifier. In this case, a selected word line <3072> is enabled to a high level, and cell data are transferred to the bit lines through charge sharing. Herein, the word line <3072> represents a first word line of the memory cell block 116.

8) Sensing of Memory Cell Block 112:

When a burst stop command 'Bs' is inputted from the exterior together with a block address for appointing the memory cell block 112, signals 'BLEQ<2>' and 'BLEQ<3>' shift to a low level. Therefore, transistors controlled by signals 'BLEQ<2>' and 'BLEQ<3>' are disabled. At the same time, the block switch transistors connecting the local input/output lines 'LIO' and '/LIO' and the main input/output lines 'MIO' and '/MIO' are enabled by signal '/BLEQ', thereby being in a ready state for a write or read operation. Thereafter, signals 'BISH<3>' and 'BISL<2>' having been at a low level shift to a high level, so that corresponding bit line isolation transistors are disabled. As a result, the electric potential levels of the bit lines 'Bit' and '/Bit', to which charge has been shared, are transferred to the sense amplifier. Then, signal 'RTO' for the sense amplifier is activated to a high level and signal 'SE' for the sense amplifier is activated to a low level, so that a voltage difference (ΔV) between the bit lines 'Bit' and '/Bit' is sensed and amplified.

9) Write (or Read) of Memory Cell Block 112:

When a write command 'Wt' (or read command 'Rd') is inputted together with a column address, an interior column address signal 'Yi' is generated (in this case, signal 'LIOPC' shifts to a low level). Accordingly, data of the local input/output lines 'LIO' and '/LIO', which have passed through the block switch transistors via the main input/output lines 'MIO' and '/MIO', are transferred to the bit lines connected to the sense amplifier. For reference, in the case of a read operation, when an interior column address signal 'Yi' is enabled, data of bit lines having been amplified by the sense amplifier are transferred to the main input/output lines via the local input/output lines and the block switch transistors.

10) Precharge of Memory Cell Block 112:

When a precharge command 'Pcg' is applied together with a block address for appointing the memory cell block 112, a word line 'WL<1024>' shifts to a low level to protect memory cell data. Then, signals 'BISH<2>' and 'BISL<3>', which have been at a low level, shift to a high level, thereby enabling the bit line isolation transistors to which the signals 'BISH<2>' and 'BISL<3>' are inputted. Therefore, signals 'BLEQ<2>' and 'BLEQ<3>' shift from low levels to high levels, thereby precharging the bit lines 'Bit' and '/Bit' and the local input/output lines 'LIO' and '/LIO' to a voltage level of 'VBLP'. At the same time, the block switch transistors connecting the local input/output lines 'LIO' and '/LIO' and the main input/output lines 'MIO' and '/MIO' are disabled by signal '/BLEQ', thereby shutting off the transmission of the data.

11) Activation of Memory Cell Block 110:

When an active command 'Act' is inputted together with a block address for appointing the memory cell block 110 and a row address for selecting a specific word line in the memory cell block 110 appointed by the block address, signals 'BISH<0>', 'BISH<1>', 'BISL<0>' and 'BISL<1>' shift to a low level. Therefore, the upper-side and lower-side bit line isolation transistors of a corresponding sense amplifier are all disabled, and the bit lines are isolated from the sense amplifier. In this case, a selected word line <1> is enabled to a high level, and cell data are transferred to the bit lines through charge sharing. Herein, the word line <1> represents a second word line of the memory cell block 110.

12) Sensing of Memory Cell Block 114:

When a burst stop command 'Bs' is inputted from the exterior together with a block address for appointing the memory cell block 114, signals 'BLEQ<4>' and 'BLEQ<5>' shift to a low level. Therefore, transistors controlled by signals 'BLEQ<4>' and 'BLEQ<5>' are disabled. At the same time, the block switch transistors connecting the local input/output lines 'LIO' and '/LIO' and the main input/output lines 'MIO' and '/MIO' are enabled by signal '/BLEQ', thereby being in a ready state for a write or read operation. Next, signals 'BISH<5>' and 'BISL<4>' having been at a low level shift to a high level, so that corresponding bit line isolation transistors are disabled. As a result, the electric potential levels of the bit lines 'Bit' and '/Bit', to which charge has been shared, are transferred to the sense amplifier. Then, signal 'RTO' for the sense amplifier is activated to a high level and signal 'SE' for the sense amplifier is activated to a low level, so that a voltage difference (ΔV) between the bit lines 'Bit' and '/Bit' is sensed and amplified.

13) Write (or Read) of Memory Cell Block 114:

When a write command 'Wt' (or read command 'Rd') is inputted together with a column address, an interior column address signal 'Yi' is generated (In this case, signal 'LIOPC' shifts to a low level). Accordingly, data of the local input/output lines 'LIO' and '/LIO', which have passed through the block switch transistors via the main input/output lines 'MIO' and '/MIO', are transferred to the bit lines connected to the sense amplifier. For reference, in the case of a read operation, when an interior column address signal 'Yi' is enabled, data of bit lines having been amplified by the sense amplifier are transferred to the main input/output lines via the local input/output lines and the block switch transistors.

14) Precharge of Memory Cell Block 114:

When a precharge command 'Pcg' is applied together with a block address for appointing the memory cell block 114, a word line 'WL<2048>' shifts to a low level to protect memory cell data. Then, signals 'BISH<4>' and 'BISL<5>', which have been at a low level, shift to a high level, thereby enabling the bit line isolation transistors to which the signals 'BISH<4>' and 'BISL<5>' are inputted. Next, signals 'BLEQ<4>' and 'BLEQ<5>' shift from low levels to high levels, thereby precharging the bit lines 'Bit' and '/Bit' and the local input/output lines 'LIO' and '/LIO' to a voltage level of 'VBLP'. At the same time, the block switch transistors connecting the local input/output lines 'LIO' and '/LIO' and the main input/output lines 'MIO' and '/MIO' are disabled by signal '/BLEQ', thereby shutting off the transmission of the data.

When charge sharing time is kept for a very long period of time while sequentially performing the above active 'Act', burst stop 'Bs', write 'Wt' (or read 'Rd') and precharge 'Pcg' operations with respect to even-numbered memory cell blocks in regular sequence (that is, in the interleave scheme), it is possible to screen current leakage caused by PVT variation and defects in a memory cell. In addition, it is possible to perform a write (or read) operation even while several memory blocks are being in an active state, so that the test time can be efficiently reduced.

When the test of the even-numbered memory cell blocks 110, 112, 114 and 116 has been finished, the active 'Act', burst stop 'Bs', write 'Wt' (or read 'Rd') and precharge 'Pcg' operations sequentially performed with respect to the odd-numbered memory cell blocks 111, 113, 115 and 117 with the interleave scheme in the same method as described above.

FIG. 3 is a waveform diagram for explaining the test method described above with reference to FIGS. 1 and 2 according to an embodiment of the present invention.

As shown in FIG. 3, it can be understood that an active operation is performed for the first word line 'WL<0>' of the memory cell block 110, an active operation is performed for the first word line 'WL<1024>' of the memory cell block 112, and an active operation is performed for the first word line 'WL<2048>' of the memory cell block 114. That is, it can be understood that active operations are performed in the interleave scheme. Thereafter, sense, write and precharge operations are sequentially performed for the memory cell block 110, and then sense, write and precharge operations are sequentially performed for the memory cell block 112. Next, an active operation is performed for the second word line 'WL<1>' of the memory cell block 110; sense, write and precharge operations are sequentially performed for the memory cell block 114; and then an active operation is performed for the second word line 'WL<1025>' of the memory cell block 112. Then, an active operation is performed for the second word line 'WL<2049>' of the memory cell block 114. Thereafter, sense, write and precharge operations are sequentially performed for the memory cell block 110. For reference, 'YI' in FIG. 3 represents an interior column address signal.

FIG. 4 is a waveform diagram illustrating the test method of the present invention by means of signals for the memory device, in which a procedure of performing a write operation is shown. Therefore, FIG. 4 may be considered as another waveform diagram of FIG. 3.

In FIG. 4, 'CMD' is an abbreviation of 'command', 'CLK' represents an exterior clock signal, '/CS' represents a chip select signal, and 'TM' represents that the test mode is on. 'Add(blk)' represents an address for appointing a memory cell block, 'B0' represents that the memory cell block 110 is selected, 'B2' represents that the memory cell block 110 is selected, 'B2' and 'B4' represent that the memory cell blocks 112 and 114 are selected, respectively. In addition, 'DIN' represents that data are inputted. Finally, 'Blk<0>', 'Blk<2>', 'Blk<4>' and 'Blk<6>', shown in the lower portion of FIG. 4, represent memory cell blocks 110, 112, 114 and 116, respectively.

FIG. 5 is a waveform diagram illustrating the test method of the present invention by means of signals for the memory device, in which a procedure of performing a read operation is shown. Compared with the procedure for the write operation described with reference to FIG. 4, the procedure of the read operation shown in FIG. 5 is equal to that for the write operation, except that a test is performed. For reference, 'DOUT' represents that data are outputted.

As shown in FIGS. 4 and 5, a time period required to perform the active, sense, write (read) and precharge operations for a specific word line (e.g., WL<0>) of a specific memory cell block (e.g., memory cell block 110) is equal to that required to perform the same operations for another word line of another memory cell block. That is, since it takes a time period of '11tCLK' (herein, 'tCLK' is a period of 'CLK') to perform the active, sense, write (read) and precharge operations for the word line 'WL<0>' of the memory cell block 110, it also takes the time period of '11tCLK' to perform the active, sense, write (read) and precharge operations for the word line 'WL<1024>' of the memory cell block 112. Similarly, the same time period is required for the other cases.

As shown in FIGS. 4 and 5, when '4tCLK' elapses after the first word line 'WL<0>' of the memory cell block 110 is enabled, the first word line 'WL<1024>' of the memory cell block 112 is enabled. Next, when '4tCLK' elapses after the first word line 'WL<1024>' of the memory cell block 112 is enabled, the first word line 'WL<2048>' of the memory cell block 114 is enabled. Then, when '4tCLK' elapses after the first word line 'WL<2048>' of the memory cell block 114 is enabled, the first word line 'WL<3072>' of the memory cell block 116 is enabled. Next, when '4tCLK' elapses after the first word line 'WL<3072>' of the memory cell block 116 is enabled, the second word line 'WL<1>' of the memory cell block 110 is enabled. Then, when '4tCLK' elapses after the second word line 'WL<1>' of the memory cell block 110 is enabled, the second word line 'WL<1025>' of the memory cell block 112 is enabled. Thereafter, the same procedure is repeated. As shown in these drawings, the memory cell blocks are sequentially and circularly activated in a period of '4tCLK', and each activated memory cell block is precharged when '11tCLK' elapses from its activated time point. Those skilled in the art will appreciate that the above-mentioned test period can be adjusted based on the number of memory cell blocks.

When the test procedure for the even-numbered memory cell blocks 110, 112, 114 and 116 have been finished, the test for the odd-numbered memory cell blocks 111, 113, 115 and 117 is performed in the same method as described above.

According to the present invention, as shown in FIGS. 1 and 2, since a sense amplifier is connected between an upper memory cell block (or cell matrix) and a lower memory cell block, the test is separately performed with respect to the even-numbered memory cell blocks and the odd-numbered memory cell blocks, respectively. However, in the case of testing a memory device in which memory cell blocks correspond one-to-one with sense amplifiers, it does not need to separate the even-numbered memory cell blocks and the odd-numbered memory cell blocks. Therefore, in this case, all the memory cell blocks can be tested in regular sequence.

In addition, although the embodiment of the present invention is described with respect to the method for first testing the even-numbered memory cell blocks and then testing the odd-numbered memory cell blocks, the above-mentioned procedure may be applied to a method for first testing the odd-numbered memory cell blocks and then testing the even-numbered memory cell blocks. In this case, the same test method as described above may be applied, except that the test sequence is reversed, so description thereof will be omitted.

The conventional method for testing a plurality of memory cell blocks is performed one after another in regular sequence in such a manner that when the test for one memory cell block has been finished, the test for another memory cell block is performed, so that a very long test period is required. However, according to an embodiment of the present invention, while the test operation for one memory cell block is being performed, test operations for multiple other memory cell blocks can be performed, so that it is possible to significantly reduce the total test time.

Although a preferred embodiment of the present invention has been described for illustrative purposes, those skilled in the art will appreciate that various modifications, additions and substitutions are possible without departing from the scope and spirit of the invention as disclosed in the accompanying claims.

What is claimed is:

1. A method for testing a memory device provided with a bank which includes a plurality of memory cell blocks (MCBs), each MCB including a plurality of word lines, the method comprising the steps of:
   a) activating MCBs in a subset one by one in a predetermined time period to point to a given word line for each MCB in the subset;
   b) performing sense, read (or write) and precharge operations on a subgroup of MCBs pointed to the given word line from MCBs in the subset;

c) activating at least one MCB in the subgroup to point at another word line for the at least one MCB;

d) completing sense, read (or write) and precharge operations on any remaining MCBs in the subset pointed at the given word line;

e) activating the remaining MCBs in the subset to point at the another word line for the remaining MCBs in the subset; and f) performing sense, read (or write) and precharge operations on all of the MCBs in the subset pointed at the another word line.

2. The method as claimed in claim 1, wherein the active, sense, read and precharge operations are performed by commands applied from an exterior of the memory device.

3. The method as claimed in claim 1, wherein the active, sense, read and precharge operations are performed sequentially in accordance to an ordering sequence of the plurality of word.

4. The method as claimed in claim 1, wherein, when sense, read (or write) and precharge operations for one of the memory cell blocks have been finished through step c), only one MCB in the subgroup is activated.

5. A method for testing a memory device provided with a bank which includes N number of memory cell blocks (MCBs) and sense amplifiers located between the MCBs, each MCB including a plurality of word lines, the method comprising the steps of:

a) expressing the N memory cell blocks as a first, a second, . . . , an Nth (herein, 'N' is a positive integer exceeding 'three') MCB into an odd-numbered (first, third, fifth, . . . ) MCB subset and into an even-numbered (second, fourth, sixth, . . . ) MCB subset;

b) activating one of the MCB subsets from among the N MCBs by activating each MCB in the one MCB subset one by one in a predetermined time period to point to a given word line for each MCB in the one MCB subset;

c) performing sense, read (or write) and precharge operations for a subgroup of the activated MCBs in the one MCB subset pointed at the given word line;

d) activating at least one MCB in the subgroup to point at another word line for the at least one MCB;

e) completing sense, read (or write) and precharge operations on any remaining MCBs in the one MCB subset pointed at the given word line;

f) activating the remaining MCBs in the one MCB subset to point at the another word line for the remaining MCBs in the one MCB subset;

g) performing sense, read (or write) and precharge operations on all of the MCBs in the one MCB subset pointed at the another word line; and h) performing steps b) to g) for the other MCB subset so that all MCBs in the bank are tested.

6. The method as claimed in claim 5, wherein the active, sense, read and precharge operations are performed sequentially in accordance to an ordering sequence of the plurality of word lines.

7. The method as claimed in claim 5, wherein, when the sense, read (or write) and precharge operations have been finished through step d), only one MCB in the subgroup is activated to point at another word line in for the only one MCB in the subgroup.

8. The method as claimed in claim 5, wherein the one MSB subset is the odd-numbered MCB subset and the other MSB subset is the even-numbered MCB subset.

9. The method as claimed in claim 8, wherein the active, sense, read and precharge operations are performed sequentially in accordance to an ordering sequence of the plurality of word lines.

10. The method as claimed in claim 5, wherein the one MSB subset is the even-numbered MCB subset and the ether MSB subset is the odd-numbered MCB subset.

* * * * *